US009327918B2

(12) United States Patent
Hayashi et al.

(10) Patent No.: US 9,327,918 B2
(45) Date of Patent: May 3, 2016

(54) SUBSTRATE PROCESSING APPARATUS AND SUBSTRATE PROCESSING METHOD FOR PERFORMING CLEANING PROCESS AND THE LIKE ON SUBSTRATE

(71) Applicant: DAINIPPON SCREEN MFG. CO., LTD., Kyoto (JP)

(72) Inventors: Motoyasu Hayashi, Kyoto (JP); Jun Shibukawa, Kyoto (JP); Mitsukazu Takahashi, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 0 days.

(21) Appl. No.: 14/019,595

(22) Filed: Sep. 6, 2013

(65) Prior Publication Data

US 2014/0093337 A1   Apr. 3, 2014

(30) Foreign Application Priority Data

Oct. 1, 2012   (JP) .................................. 2012-219502

(51) Int. Cl.
 *H01L 21/677* (2006.01)
 *B65G 49/00* (2006.01)
 (Continued)

(52) U.S. Cl.
 CPC .......... *B65G 49/00* (2013.01); *H01L 21/67201* (2013.01); *H01L 21/67742* (2013.01); *H01L 21/67766* (2013.01); *H01L 21/67781* (2013.01); *H01L 21/68707* (2013.01)

(58) Field of Classification Search
 CPC ................... H01L 21/67201; H01L 21/67742; H01L 21/67766; H01L 21/67781; H01L 21/68707
 See application file for complete search history.

(56) References Cited

U.S. PATENT DOCUMENTS 6,361,422 B1   3/2002   Ettinger et al. ............... 451/339
6,406,359 B1 *  6/2002   Birang et al. .................. 451/67
(Continued)

FOREIGN PATENT DOCUMENTS

JP   10-209243   8/1998
JP   2000-228438   8/2000
(Continued)

OTHER PUBLICATIONS

Search Report issued by Taiwanese Patent Office on Feb. 5, 2015 in connection with corresponding Taiwanese Application No. 102134340 with English and Japanese translations thereof.
(Continued)

*Primary Examiner* — Ernesto Suarez
*Assistant Examiner* — Ronald Jarrett
(74) *Attorney, Agent, or Firm* — Ostrolenk Faber LLP

(57) ABSTRACT

For the transport of a substrate from a cassette to a back surface cleaning processing unit in a cleaning processing block, a transfer robot rotates the substrate through 90 degrees from a horizontal attitude in which the front surface of the substrate is positioned to face upward into a standing attitude while transporting the substrate out of a cassette to a substrate passing part, and passes the substrate in the standing attitude to the substrate passing part. The substrate passing part holds the substrate in the standing attitude. A main transport robot receives the substrate held in the standing attitude. The main transport robot rotates the substrate through 90 degrees from the standing attitude into a horizontal attitude in which the back surface of the substrate is positioned to face upward while transporting the substrate from the substrate passing part to the back surface cleaning processing unit.

7 Claims, 11 Drawing Sheets

(51) Int. Cl.
*H01L 21/67* (2006.01)
*H01L 21/687* (2006.01)

(56) References Cited

U.S. PATENT DOCUMENTS

| | | | |
|---|---|---|---|
| 6,648,588 B2* | 11/2003 | Shanmugasundram et al. | 414/806 |
| 2006/0045722 A1* | 3/2006 | Hashimoto | 414/754 |
| 2008/0156351 A1 | 7/2008 | Mitsuyoshi et al. | |
| 2009/0211040 A1* | 8/2009 | Shibukawa et al. | 15/21.1 |
| 2012/0143366 A1* | 6/2012 | Machida | 700/112 |
| 2012/0149198 A1* | 6/2012 | Schwandner | 438/693 |

FOREIGN PATENT DOCUMENTS

| | | |
|---|---|---|
| JP | 2002-159927 | 6/2002 |
| JP | 2003-100695 | 4/2003 |
| JP | 2004-088115 | 3/2004 |
| JP | 2010-045214 | 2/2010 |
| KR | 10-2008-0061289 | 7/2008 |

OTHER PUBLICATIONS

Office Action issued by Korean Patent Office on Oct. 15, 2014 in connection with corresponding Korean Patent Application No. 10-2013-0113219.

* cited by examiner

F I G. 4 A
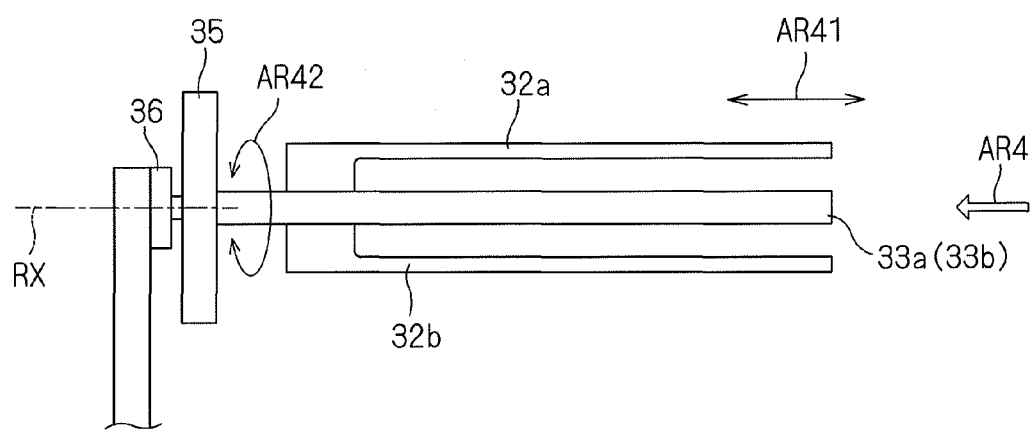
F I G. 4 B
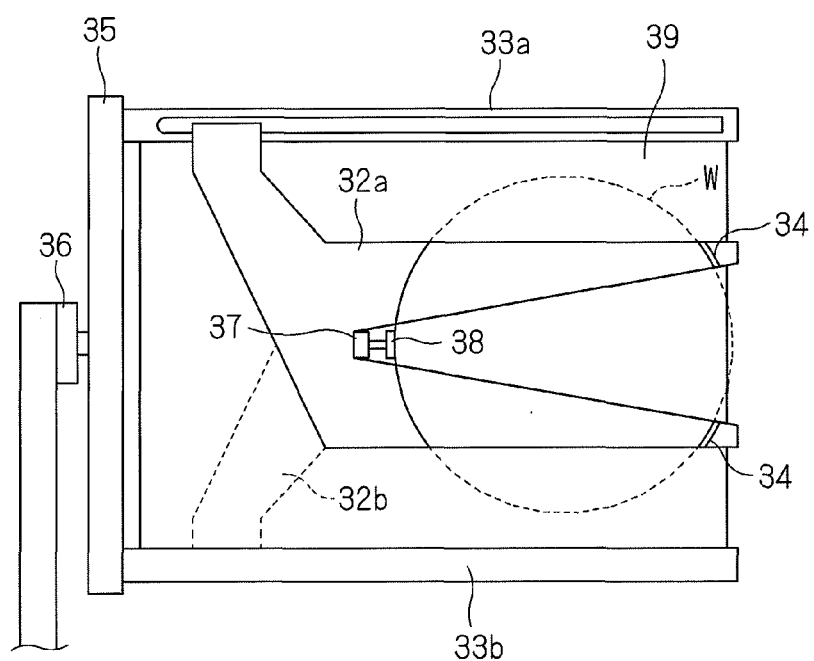

F I G. 5 A
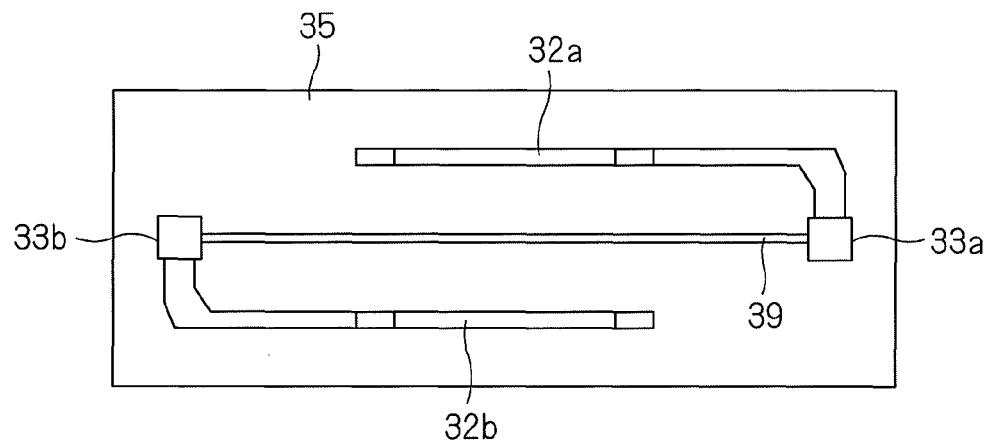
F I G. 5 B
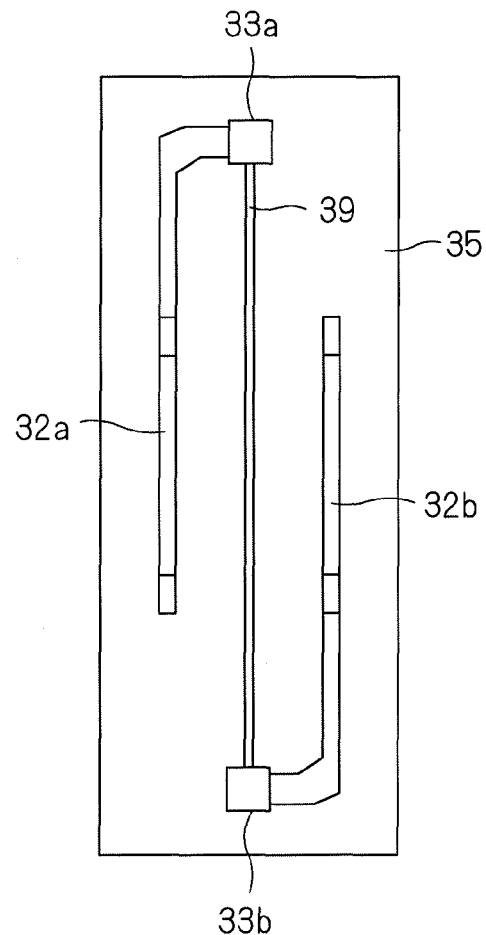

F I G . 8
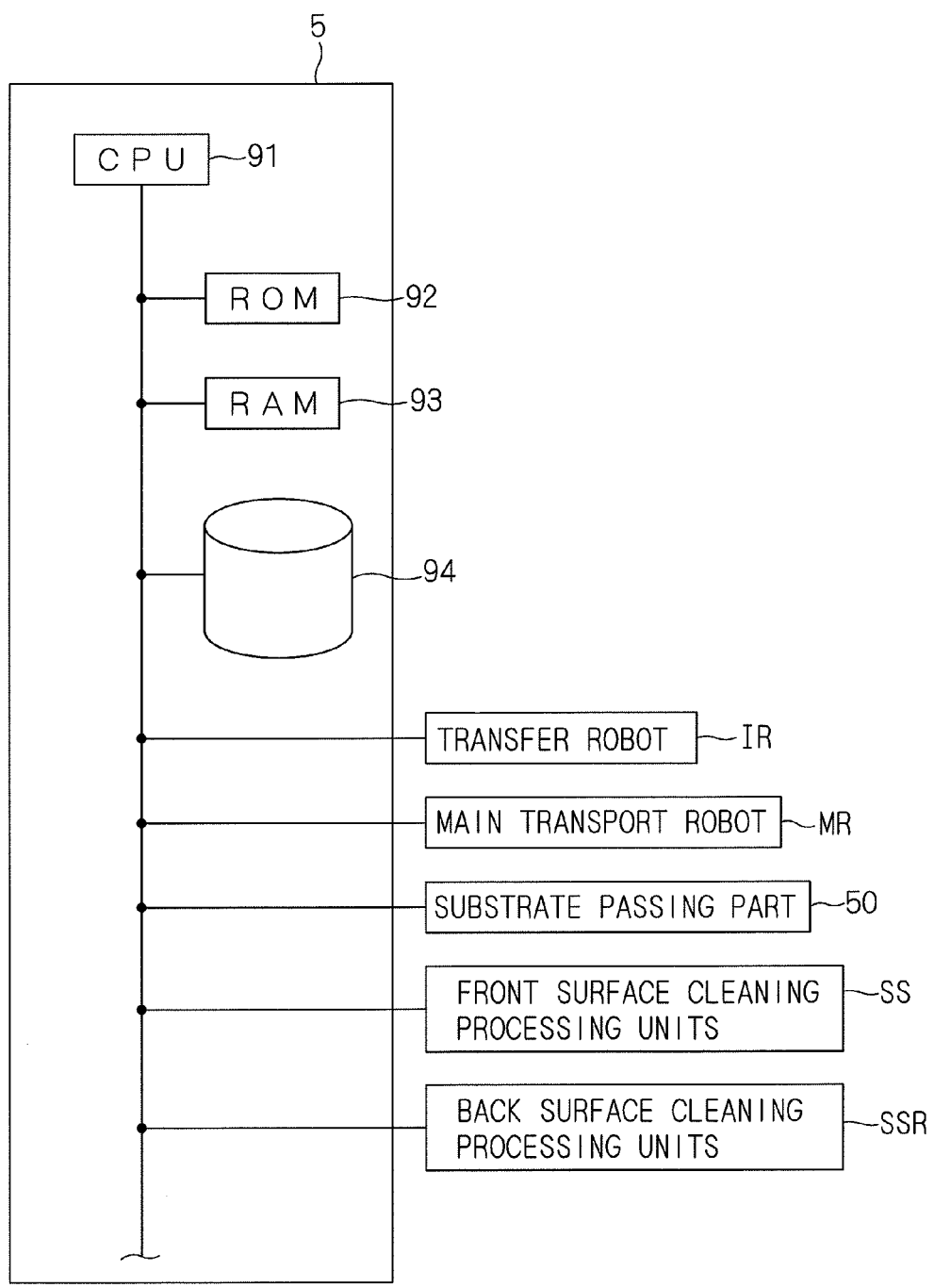

F I G . 9

| | | |
|---|---|---|
| | CASSETTE | FRONT |
| | TRANSFER ROBOT | FRONT→STANDING |
| | VERTICAL PASS | STANDING |
| | MAIN TRANSPORT ROBOT | STANDING→BACK |
| BACK SURFACE CLEANING PROCESSING UNIT | | BACK |
| | MAIN TRANSPORT ROBOT | BACK→FRONT |
| FRONT SURFACE CLEANING PROCESSING UNIT | | FRONT |
| | MAIN TRANSPORT ROBOT | FRONT→STANDING |
| | VERTICAL PASS | STANDING |
| | TRANSFER ROBOT | STANDING→FRONT |
| | CASSETTE | FRONT |

SUBSTRATE PROCESSING APPARATUS AND SUBSTRATE PROCESSING METHOD FOR PERFORMING CLEANING PROCESS AND THE LIKE ON SUBSTRATE

BACKGROUND OF THE INVENTION

1. Field of the Invention

The present invention relates to a substrate processing apparatus which sequentially transports thin plate-like precision electronic substrates such as semiconductor wafers, glass substrates for liquid crystal display devices and substrates for solar cells (hereinafter referred to simply as "substrates") to perform a cleaning process and the like on the substrates.

2. Description of the Background Art

As is well known, semiconductor and liquid crystal display products and the like are fabricated by performing a series of processes including cleaning, resist coating, exposure, development, etching, interlayer insulation film formation, heat treatment, dicing and the like on the aforementioned substrates. A scrub cleaning process which brings a brush into contact with or into proximity to a main surface of a rotating substrate to mechanically remove deposits from the main surface of the substrate is known as one of the processes of cleaning substrates. A substrate processing apparatus which performs such a scrub cleaning process is disclosed in U.S. Patent Application Publication No. 2008/0156351.

In the substrate processing apparatus disclosed in U.S. Patent Application Publication No. 2008/0156351, an indexer block which accumulates unprocessed substrates and processed substrates therein and a processing block which performs the scrub cleaning process on the substrates are provided in juxtaposition. In general, the scrub cleaning process is performed on not only the front surface of a substrate but also the back surface thereof. The processing block disclosed in U.S. Patent Application Publication No. 2008/0156351 carries front surface cleaning units and back surface cleaning units. In the back surface cleaning units, the process is performed on a substrate with a back surface positioned to face upward. This necessitates a mechanism for inverting or flipping a substrate in the substrate processing apparatus which performs the back surface cleaning.

In the substrate processing apparatus disclosed in U.S. Patent Application Publication No. 2008/0156351, inverting units (referred to as "reversing units" in this publication) are provided as a substrate passing part at a connecting portion of the indexer block and the processing block. In other words, the substrate passing part present between the indexer block and the processing block to pass substrates therebetween also functions as the inverting units. This reduces the transporting steps in the apparatus disclosed in U.S. Patent Application Publication No. 2008/0156351 to improve the throughput for substrate processing.

However, the provision of an inverting unit for inverting a substrate and the step of inverting the substrate 180 degrees by means of the inverting unit are essential for the background art techniques including U.S. Patent Application Publication No. 2008/0156351. Accordingly, the time to perform this step is required for the background art techniques. For this reason, there is a limit on the shortening of the time required until a substrate is transported into the back surface cleaning unit. In particular, the 180-degree inversion of large-diameter semiconductor wafers having a diameter of 450 mm whose future developments are being contemplated requires longer time than that of conventional semiconductor wafers (having a diameter of 300 mm or less). Thus, there is a danger that throughput decreases for such large-diameter semiconductor wafers.

An inverting unit for inverting large-diameter semiconductor wafers is accordingly large in size to present another problem in the increase in the size of the substrate processing apparatus.

SUMMARY OF THE INVENTION

According to one aspect of the present invention, a substrate processing apparatus comprises: a processing block including a main transport robot and a processing part to which a substrate is transported by the main transport robot; an indexer block including a transfer robot, the indexer block taking an unprocessed substrate out of a cassette to pass the unprocessed substrate to the processing block, the indexer block receiving a processed substrate from the processing block to store the processed substrate into a cassette; and a passing part provided at a connecting portion of the indexer block and the processing block, the passing part holding a substrate passed between the main transport robot and the transfer robot in a standing attitude, the main transport robot including a first hand for gripping a substrate, and a first rotation mechanism for rotating the first hand through at least 90 degrees about an axis extending in a horizontal direction, the main transport robot transporting a substrate between the passing part and the processing part while rotating the substrate gripped by the first hand through 90 degrees about the axis extending in a horizontal direction, the transfer robot including a second hand for gripping a substrate, and a second rotation mechanism for rotating the second hand through at least 90 degrees about an axis extending in a horizontal direction, the transfer robot transporting a substrate between the passing part and the cassette while rotating the substrate gripped by the second hand through 90 degrees about the axis extending in a horizontal direction.

Each of the transfer robot and the main transport robot is responsible for the rotation of the substrate through 90 degrees to achieve the 180-degree inversion of the substrate. In addition, each of the transfer robot and the main transport robot rotates the substrate through 90 degrees while transporting the substrate. This further shortens the time required to invert the substrate and to transport the substrate to the processing part.

Preferably, the main transport robot moves upwardly and downwardly in a vertical direction while causing the substrate gripped by the first hand to assume a standing attitude, and the transfer robot moves upwardly and downwardly in a vertical direction while causing the substrate gripped by the second hand to assume a standing attitude.

This minimizes air resistance exerted on the substrate during the upward and downward movements. Thus, the substrate is smoothly moved upwardly and downwardly.

According to another aspect of the present invention, a method of processing a substrate comprises the steps of: (a) taking an unprocessed substrate out of a cassette to pass the unprocessed substrate to a passing part by means of a transfer robot while rotating the unprocessed substrate through 90 degrees about an axis extending in a horizontal direction; (b) holding the unprocessed substrate received from the transfer robot in a standing attitude by means of the passing part; (c) transferring the unprocessed substrate from the passing part to a main transport robot to transport the unprocessed substrate to a processing part by means of the main transport robot while rotating the unprocessed substrate through 90 degrees about an axis extending in a horizontal direction; (d)

transferring a processed substrate from the processing part to the main transport robot to pass the processed substrate to the passing part by means of the main transport robot while rotating the processed substrate through 90 degrees about an axis extending in a horizontal direction; (e) holding the processed substrate received from the main transport robot in a standing attitude by means of the passing part; and (f) transferring the processed substrate from the passing part to the transfer robot to transport the processed substrate into a cassette by means of the transfer robot while rotating the processed substrate through 90 degrees about an axis extending in a horizontal direction.

Each of the transfer robot and the main transport robot is responsible for the rotation of the substrate through 90 degrees to achieve the 180-degree inversion of the substrate. In addition, each of the transfer robot and the main transport robot rotates the substrate through 90 degrees while transporting the substrate. This further shortens the time required to invert the substrate and to transport the substrate to the processing part.

Preferably, the step (a) and the step (0 include the step of moving the substrate upwardly and downwardly in a vertical direction by means of the transfer robot while causing the substrate to assume a standing attitude, and the step (c) and the step (d) include the step of moving the substrate upwardly and downwardly in a vertical direction by means of the main transport robot while causing the substrate to assume a standing attitude.

This minimizes air resistance exerted on the substrate during the upward and downward movements. Thus, the substrate is smoothly moved upwardly and downwardly.

It is therefore an object of the present invention to further shorten the time required to invert a substrate and to transport the substrate to a processing part.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 4A, 4B, 5A and 5B are views showing a structure of a transport hand in a main transport robot;

FIG. 8 is a control block diagram of a controller;

FIG. 9 shows a correlation between the position and attitude of substrates;

DESCRIPTION OF THE PREFERRED EMBODIMENTS

Figure 1:
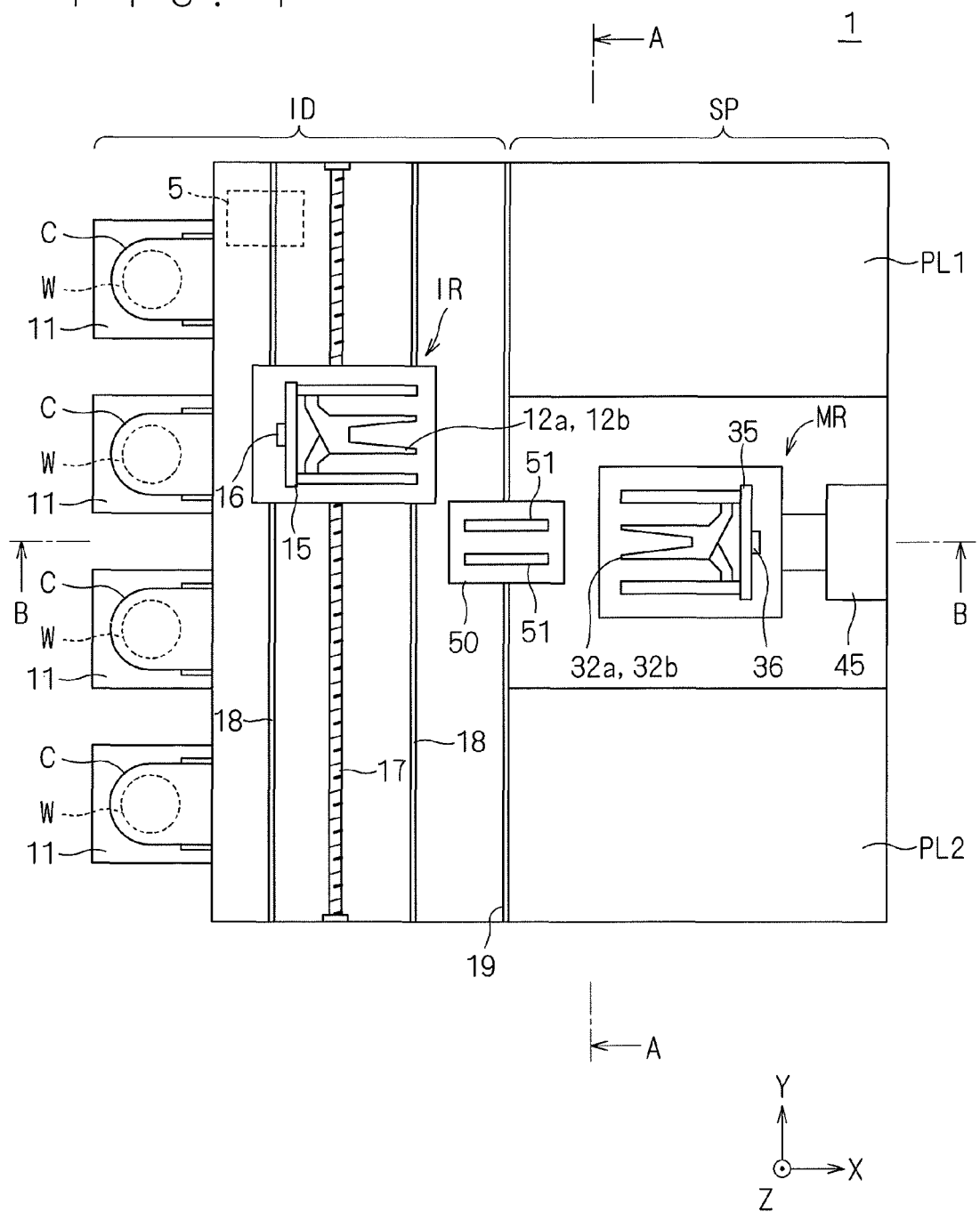
FIG. 1 is a plan view of a substrate processing apparatus according to the present invention.

Preferred embodiments according to the present invention will now be described in detail with reference to the drawings. In FIG. 1 and the subsequent figures, the dimensions of components and the number of components are shown in exaggeration or in simplified form, as appropriate, for the sake of easier understanding.

1. First Preferred Embodiment

Figure 2:
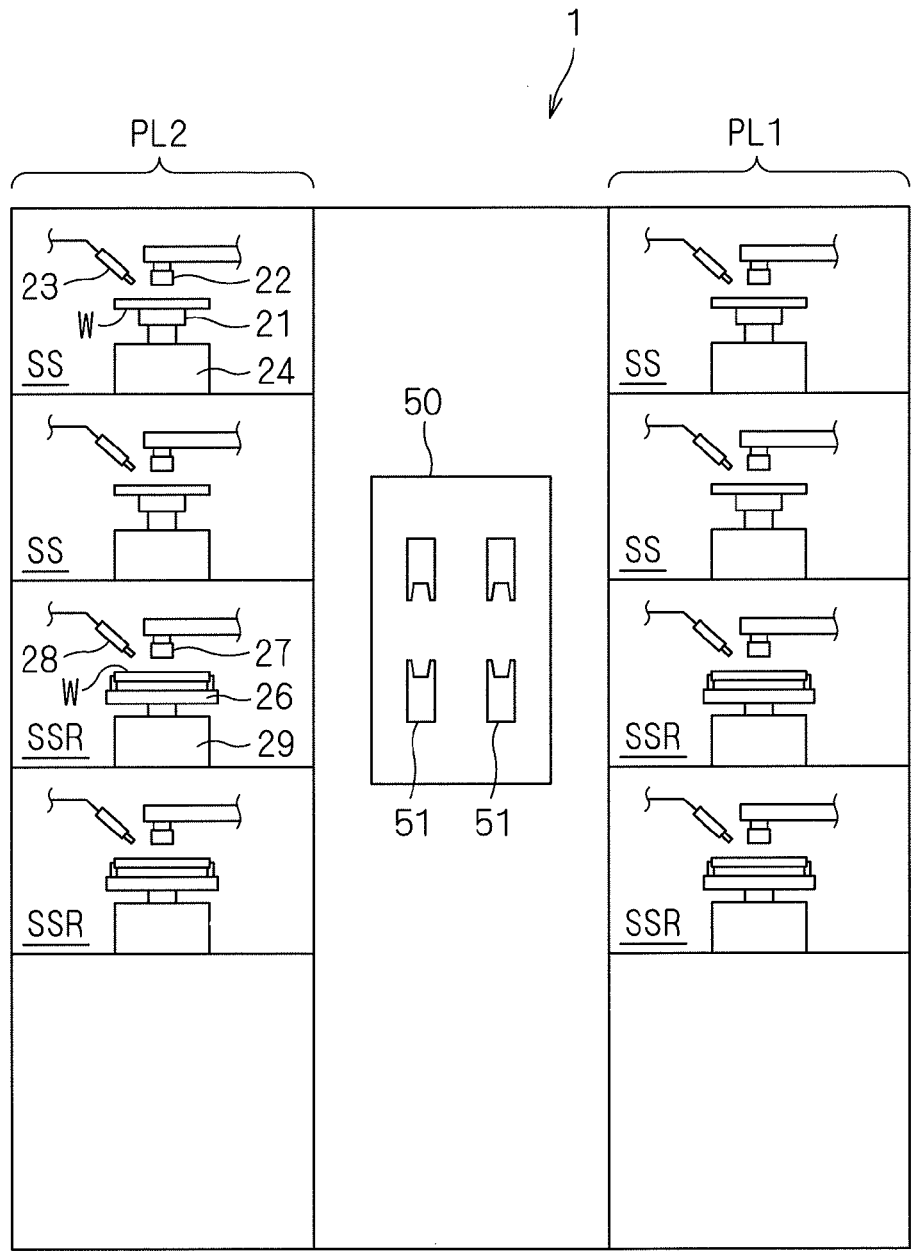
FIG. 2 is a view of the substrate processing apparatus taken along the line A-A of FIG. 1.
Figure 3:
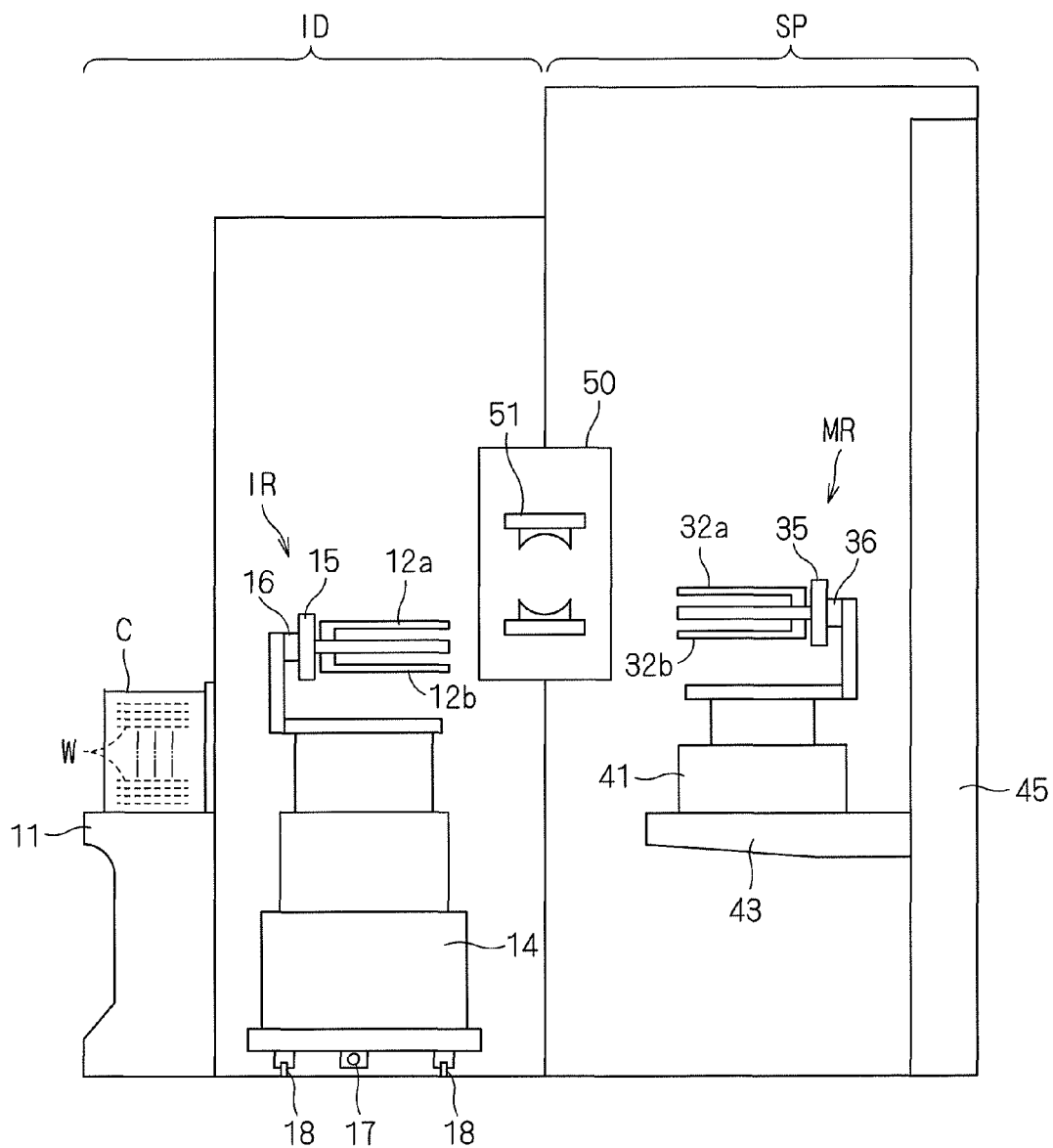
FIG. 3 is a view of the substrate processing apparatus taken along the line B-B of FIG. 1.

FIG. 1 is a plan view of a substrate processing apparatus 1 according to the present invention. FIG. 2 is a view of the substrate processing apparatus 1 taken along the line A-A of FIG. 1, and FIG. 3 is a view of the substrate processing apparatus 1 taken along the line B-B of FIG. 1. An XYZ rectangular coordinate system in which an XY plane is defined as a horizontal plane and a Z axis is defined to extend in a vertical direction is additionally shown in FIGS. 1 to 3 for purposes of clarifying the directional relationship therebetween. The substrate processing apparatus 1 is a cleaning apparatus for performing a scrub cleaning process on a plurality of substrates W in succession, and includes two blocks (processing sections): an indexer block ID and a cleaning processing block SP, which are provided in juxtaposition. Each of the substrates W according to the present preferred embodiment is a disk-shaped semiconductor wafer. The substrate processing apparatus 1 further includes a controller 5 which controls operating mechanisms provided in the indexer block ID and the cleaning processing block SP to cause the operating mechanisms to perform the cleaning process of the substrates W. The indexer block ID is a processing section for transferring an unprocessed substrate W received from the outside of the substrate processing apparatus 1 to the cleaning processing block SP and for transporting a processed substrate W received from the cleaning processing block SP to the outside of the substrate processing apparatus 1. The indexer block ID includes a plurality of (in this preferred embodiment, four) cassette stages 11 for placing cassettes C thereon, and a transfer robot IR for taking an unprocessed substrate W out of each of the cassettes C and for storing a processed substrate W into each of the cassettes C.

An OHT (overhead hoist transfer) or the like transports a cassette C with unprocessed substrates W stored therein from the outside of the substrate processing apparatus 1 to place the cassette C on each of the cassette stages 11. Substrates W subjected to the scrub cleaning process in the substrate processing apparatus 1 are stored again in a cassette C placed on each of the cassette stages 11. The OHT or the like transports the cassette C with the processed substrates W stored therein to the outside of the substrate processing apparatus 1. That is, the cassette stages 11 function as a substrate accumulation part for accumulating the unprocessed substrates W and the processed substrates W. The cassettes C may be of the following types: an SMIF (standard mechanical interface) pod, and an OC (open cassette) which exposes stored substrates W to the outside atmosphere, in addition to a FOUP (front opening unified pod) which stores substrates W in an enclosed or sealed space.

The transfer robot IR includes two transfer hands (second hands) 12a and 12b. The transfer robot IR causes the transfer hands 12a and 12b to gain access to the cassettes C placed on the cassette stages 11 and to a substrate passing part 50 to be described later, thereby transporting substrates W between the cassettes C and the substrate passing part 50. The transfer robot IR is capable of rotating the transfer hands 12a and 12b about an axis extending in a horizontal direction to cause the transfer hands 12a and 12b in an attitude rotated through 90 degrees from its horizontal attitude to gain access to the substrate passing part 50, which will be described in detail later.

The cleaning processing block SP is provided in adjacent relation to the indexer block ID. A partition 19 for closing off the communication of atmosphere is provided between the indexer block ID and the cleaning processing block SP. The substrate passing part 50 is provided to extend through the partition 19. That is, the substrate passing part 50 is provided at a connecting portion of the indexer block ID and the cleaning processing block SP, and is present between the indexer block ID and the cleaning processing block SP to pass substrates W therebetween. The substrate passing part 50 includes two vertical passes 51, which will be described in detail later.

The cleaning processing block SP is a processing section for performing the scrub cleaning process on substrates W, and includes a first processing part array PL1 and a second processing part array PL2 which perform the scrub cleaning process on the substrates W, and a main transport robot MR for transporting the substrates W between processing parts included in the first and second processing part arrays PL1 and PL2. In the cleaning processing block SP, the first processing part array PL1 and the second processing part array PL2 are arranged on opposite sides of the main transport robot MR. Specifically, the first processing part array PL1 is on the positive Y side, and the second processing part array PL2 is on the negative Y side.

As shown in FIG. 2, each of the first processing part array PL1 and the second processing part array PL2 includes four processing parts arranged in stacked relation and each performing the scrub cleaning process. The first processing part array PL1 includes two front surface cleaning processing units SS and two back surface cleaning processing units SSR serving as the processing parts and arranged in stacked relation in top-to-bottom order. Similarly, the second processing part array PL2 includes two front surface cleaning processing units SS and two back surface cleaning processing units SSR serving as the processing parts and arranged in stacked relation in top-to-bottom order.

Each of the front surface cleaning processing units SS includes a spin chuck 21 for holding a substrate W with a front surface positioned to face upward in a horizontal attitude to rotate the substrate W about an axis extending in a vertical direction, a cleaning brush 22 in contact with or in proximity to the front surface of the substrate W held on the spin chuck 21 to perform scrub cleaning on the front surface of the substrate W, a nozzle 23 for applying a cleaning liquid (e.g., deionized water) onto the front surface of the substrate W, a spin motor 24 for rotatably driving the spin chuck 21, a cup (not shown) surrounding the substrate W held on the spin chuck 21, and the like. While rotating the substrate W held on the spin chuck 21, each of the front surface cleaning processing units SS supplies the cleaning liquid from the nozzle 23 onto the front surface of the substrate W and brings the cleaning brush 22 into contact with or into proximity to the front surface of the substrate W to perform the scrub cleaning process on the front surface of the substrate W. The term "front surface" of a substrate W used herein refers to a main surface of the substrate W where a pattern is formed, and the term "back surface" thereof refers to a surface opposite from the front surface. The term "upper surface" of a substrate W used herein refers to a main surface of the substrate W which is positioned to face upward, and the term "lower surface" thereof refers to a surface which is positioned to face downward (regardless of whether the surface is the front surface or the back surface).

Each of the back surface cleaning processing units SSR, on the other hand, includes a spin chuck 26 for holding a substrate W with a back surface positioned to face upward in a horizontal attitude to rotate the substrate W about an axis extending in a vertical direction, a cleaning brush 27 in contact with or in proximity to the back surface of the substrate W held on the spin chuck 26 to perform scrub cleaning on the back surface of the substrate W, a nozzle 28 for applying a cleaning liquid (e.g., deionized water) onto the back surface of the substrate W, a spin motor 29 for rotatably driving the spin chuck 26, a cup (not shown) surrounding the substrate W held on the spin chuck 26, and the like. While rotating the substrate W held on the spin chuck 26, each of the back surface cleaning processing units SSR supplies the cleaning liquid from the nozzle 28 onto the back surface of the substrate W and brings the cleaning brush 27 into contact with or into proximity to the back surface of the substrate W to perform the scrub cleaning process on the back surface of the substrate W. The spin chuck 21 in each of the front surface cleaning processing units SS which perform the front surface cleaning process may be of a vacuum suction type because the spin chuck 21 holds the back surface of the substrate W. However, the spin chuck 26 in each of the back surface cleaning processing units SSR which perform the back surface cleaning process is preferably of the type which mechanically grips an edge portion of the substrate W because the spin chuck 26 holds the front surface of the substrate W.

The main transport robot MR includes two transport hands (first hands) 32a and 32b, and causes the transport hands 32a and 32b to gain access to the processing parts included in the first processing part array PL1 and the second processing part array PL2 and to the substrate passing part 50, thereby transporting substrates W between the substrate passing part 50 and the processing parts. The main transport robot MR is capable of rotating the transport hands 32a and 32b about an axis extending in a horizontal direction to cause the transport hands 32a and 32b in an attitude rotated through 90 degrees from its horizontal attitude to gain access to the substrate passing part 50.

FIGS. 4A, 4B, 5A and 5B are views showing a structure of the transport hands 32a and 32b of the main transport robot MR. FIGS. 4A and 4B are side views of the transport hands 32a and 32b, and FIGS. 5A and 5B are views of the transport hands 32a and 32b as seen in the direction of an arrow AR4 in FIG. 4A. Also, FIGS. 4A and 5A are views of the transport hands 32a and 32b in a horizontal attitude, and FIGS. 4B and 5B are views of the transport hands 32a and 32b in an attitude rotated through 90 degrees from the horizontal attitude.

Two slide arms 33a and 33b are provided fixedly on a rotary plate 35 so as to extend in a horizontal direction. The transport hand 32a is mounted movably forwardly and backwardly in a horizontal direction to the slide arm 33a. A slide drive mechanism not shown is attached to the slide arm 33a, and causes the transport hand 32a to move forwardly and backwardly as indicated by an arrow AR41. On the other hand, the transport hand 32b is mounted movably forwardly and backwardly in a horizontal direction to the slide arm 33b. A slide drive mechanism not shown is attached also to the slide arm 33b, and causes the transport hand 32b to move forwardly and backwardly as indicated by the arrow AR41. Thus, the transport hands 32a and 32b are moved forwardly and backwardly independently of each other.

A rotary actuator (first rotation mechanism) 36 rotates the rotary plate 35 about a rotation center axis RX extending in a horizontal direction. The rotation center axis RX passes through the center of the rotary plate 35, and is parallel to a direction in which the transport hands 32a and 32b are moved forwardly and backwardly. The slide arms 33a and 33b are placed symmetrically with respect to the rotation center axis RX. The two transport hands 32a and 32b are also placed symmetrically with respect to the rotation center axis RX when the positions of the forward and backward movements of the transport hands 32a and 32b are the same. Thus, when the rotary actuator 36 rotates the rotary plate 35 through 180 degrees, the transport hands 32a and 32b switch positions with each other. The shape of the rotary plate 35 is required only to be able to support the two slide arms 33a and 33b, and may be rectangular or disk-shaped.

As shown in FIG. 4B, each of the transport hands 32a and 32b is in a forked form having two fingers as seen in plan view. The forked portion of each of the transport hands 32a and 32b holds a single substrate W. The forked form of each of the transport hands 32a and 32b is configured not to interfere with passing pins of the processing parts and the like.

Locking portions 34 are provided on the respective tips of the two fingers of each of the transport hands 32a and 32b. A gripping mechanism 37 is provided in a position corresponding to the base of the two fingers. The gripping mechanism 37 moves a gripping portion 38 forwardly and backwardly in a horizontal direction. Various known linear drive mechanisms such as an air cylinder and an actuator may be used as the gripping mechanism 37. A substrate W is placed on the forked portion of each of the transport hands 32a and 32b, and the gripping mechanism 37 moves the gripping portion 38 forwardly. This causes the substrate W to be gripped at three points by the two locking portions 34 and the gripping portion 38 with reliability. With the substrate W gripped by the gripping mechanism 37, an appropriate gripping force is maintained so that the substrate W is prevented from falling off if each of the transport hands 32a and 32b is rotated through 180 degrees, i.e. inverted. When the gripping mechanism 37 moves the gripping portion 38 backwardly, the grip of the substrate W is released. This allows the substrate W to be passed to and from each of the transport hands 32a and 32b.

A shielding plate 39 is provided between the two slide arms 33a and 33b in the present preferred embodiment. The shielding plate 39 functions as a partition to prevent particles and the like from moving between the substrate W held by the transport hand 32a and the substrate W held by the transport hand 32b.

Referring FIGS. 1 and 3 again, the two transport hands 32a and 32b and the rotary actuator 36 are supported by a support portion 41. The support portion 41 is mounted on a base 43. The support portion 41 is pivoted within a horizontal plane relative to the base 43 by a built-in rotation drive mechanism. This causes the transport hands 32a and 32b to pivot within a horizontal plane.

The base 43 is mounted to a lifting drive mechanism 45. The lifting drive mechanism 45 is provided fixedly to the frame of the cleaning processing block SP. The lifting drive mechanism 45 incorporates a linear drive mechanism to move the base 43 upwardly and downwardly in a vertical direction (in a direction of the Z axis). This causes the transport hands 32a and 32b to move upwardly and downwardly in a vertical direction.

The main transport robot MR with such a configuration causes the two transport hands 32a and 32b to move upwardly and downwardly in a vertical direction and to pivot the transport hands 32a and 32b within a horizontal plane. The main transport robot MR also causes the two transport hands 32a and 32b to rotate in a collective manner about the rotation center axis RX extending in a horizontal direction and to move individually independently of each other forwardly and backwardly in a horizontal direction (in the direction of the pivot radius of the support portion 41). Thus, the main transport robot MR causes the two transport hands 32a and 32b to individually gain access to the processing parts (the front surface cleaning processing units SS and the back surface cleaning processing units SSR) included in the first processing part array PL1 and the second processing part array PL2 and to the substrate passing part 50, thereby transferring substrates W to and from these parts. It should be noted that the whole of the main transport robot MR does not move in a horizontal direction because the lifting drive mechanism 45 is fixedly provided.

On the other hand, the transfer hands 12a and 12b of the transfer robot IR are identical in structure to the transport hands 32a and 32b of the main transport robot MR. Specifically, the transfer hand 12a is mounted to one out of two slide arms provided fixedly on a rotary plate 15, and the transfer hand 12b is mounted to the other of the slide arms (with reference to FIGS. 1 and 3). The transfer hands 12a and 12b are moved forwardly and backwardly in a horizontal direction by the slide arms. A rotary actuator (second rotation mechanism) 16 rotates the rotary plate 15 about a rotation center axis extending in a horizontal direction, as in the main transport robot MR.

Each of the transfer hands 12a and 12b includes a gripping mechanism similar to that in the transport hands 32a and 32b, and is capable of gripping a substrate W held thereby. Thus, an appropriate gripping force is maintained so that the substrate W held by each of the transfer hands 12a and 12b is prevented from falling off if each of the transfer hands 12a and 12b is rotated by the rotary actuator 16. Further, a shielding plate is provided between the two slide arms, as in the main transport robot MR, to function as a partition between the transfer hand 12a and the transfer hand 12b.

As shown in FIGS. 1 and 3, the two transfer hands 12a and 12b and the rotary actuator 16 are supported by a movable portion 14. The movable portion 14 is in threaded engagement with a ball screw 17 extending in parallel with the arrangement of the cassette stages 11 (in a direction of the Y axis), and is provided slidably relative to two guide rails 18. Thus, as a rotary motor not shown rotates the ball screw 17, the whole of the transfer robot IR including the movable portion 14 moves horizontally in a direction of the Y axis.

The movable portion 14 is movable in a horizontal direction, and is pivoted in itself within a horizontal plane by a built-in rotation drive mechanism. The movable portion 14 is moved upwardly and downwardly in a vertical direction by telescopically extending and retracting a plurality of supports having a telescopic structure (what is called a telescopic mechanism). This causes the transfer hands 12a and 12b to pivot within a horizontal plane and to move upwardly and downwardly in a vertical direction.

The transfer robot IR with such a configuration causes the two transfer hands 12a and 12b to move horizontally in a direction of the Y axis, to move upwardly and downwardly in a vertical direction and to pivot within a horizontal plane. The transfer robot IR also causes the two transfer hands 12a and 12b to rotate in a collective manner about the rotation center axis extending in a horizontal direction and to move individually independently of each other forwardly and backwardly in a horizontal direction (in the direction of the pivot radius of the movable portion 14). Thus, the transfer robot IR causes the two transfer hands 12a and 12b to individually gain access to the cassettes C placed on the cassette stages 11 and to the substrate passing part 50, thereby transferring substrates W to and from these parts.

Figure 6:
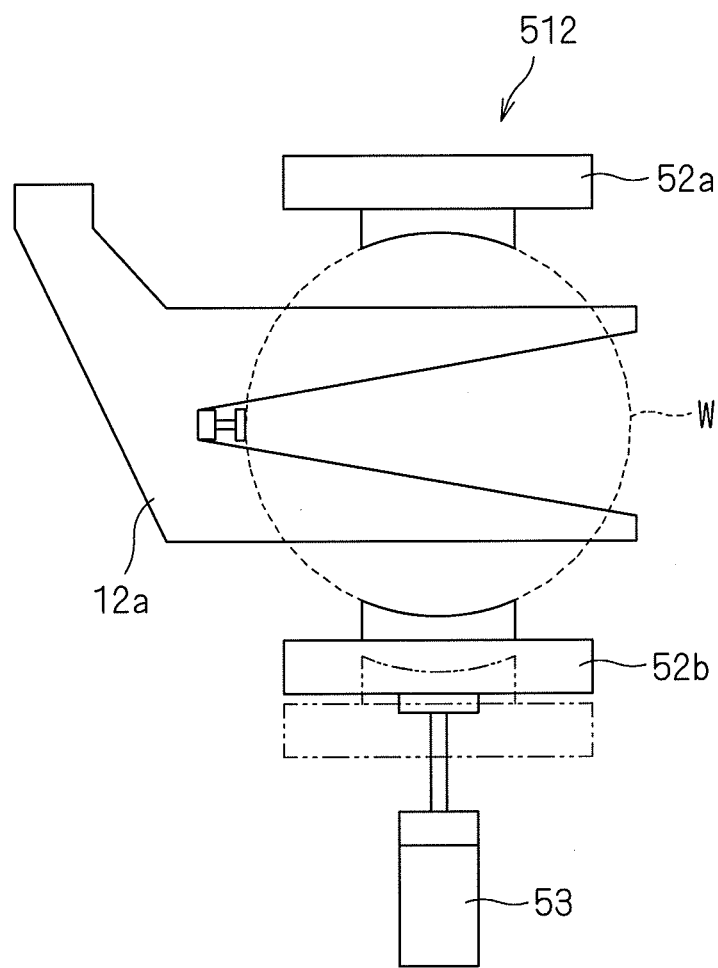
FIGS. 6 and 7 are views showing a structure of vertical passes in a substrate passing part.
Figure 7:
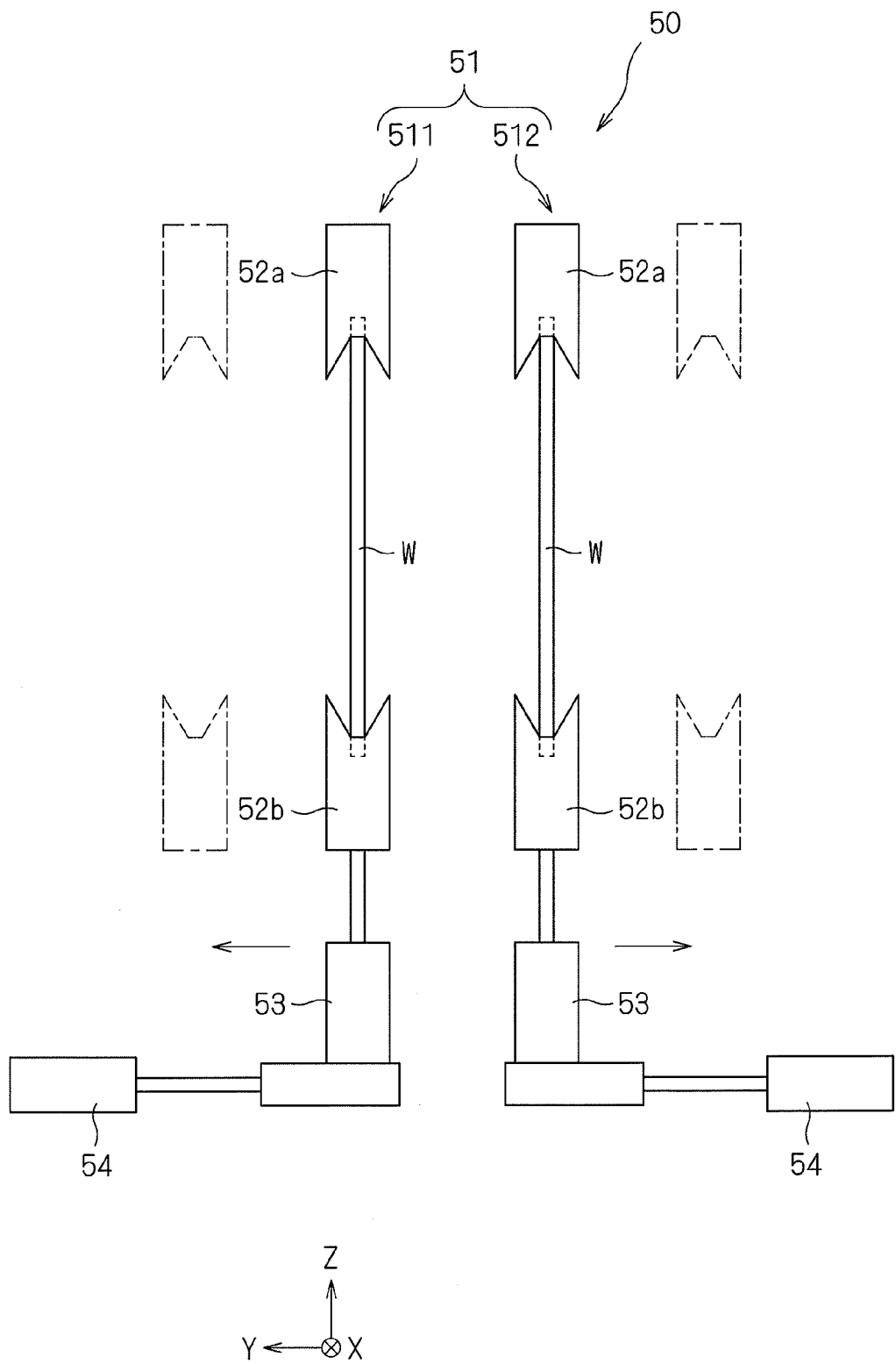

Two vertical passes 511 and 512 (which are generically referred to as "vertical passes 51" unless otherwise identified) are provided in the substrate passing part 50. FIGS. 6 and 7 are views showing the structure of the vertical passes 51. FIG. 6 is a view of the vertical passes 51 as seen in a direction of the Y axis (from the negative Y side), and FIG. 7 is a view of the vertical passes 51 as seen in a direction of the X axis (from the negative X side). Each vertical pass 51 includes a pair of grippers 52a and 52b and a gripping mechanism 53. The gripper 52a and the gripper 52b are provided in opposed relation to each other in a vertical direction (in a direction of the Z axis). In the present preferred embodiment, the upper gripper 52a is fixed so as not to move in a vertical direction. The lower gripper 52b, on the other hand, is moved upwardly and downwardly by the gripping mechanism 53. Each of the lower end of the gripper 52a and the upper end of the gripper 52b has a groove formed therein and extending along the outer periphery of a circular substrate W. Various known linear drive mechanisms such as an air cylinder and an actuator may be used as the gripping mechanism 53.

The two vertical passes 511 and 512 are movable in a direction of the Y axis by respective slide drive mechanisms 54 (FIG. 7). When the vertical passes 511 and 512 move in a direction of the Y axis, the pair of grippers 52a and 52b cooperatively move so as to be maintained in opposed relation. Various known linear drive mechanisms such as an air cylinder and an actuator may be used as the slide drive mechanisms 54. The slide drive mechanisms 54 may be individually provided for the two vertical passes 511 and 512, respectively, to move the two vertical passes 511 and 512 independently of each other, as shown in FIG. 7. Alternatively, a single slide drive mechanism 54 may be used to move the two vertical passes 511 and 512 in a collective manner.

When the gripping mechanism 53 places the lower gripper 52b in a lowered position indicated by dash-double-dot lines in FIG. 6, a substrate W in a standing attitude is allowed to be brought into and out of the space between the upper gripper 52a and the lower gripper 52b. The term "standing attitude" used herein refers to an attitude in which a main surface of the substrate W extends in a vertical direction, that is, in which the normal to the main surface extends in a horizontal direction. The "standing attitude" includes an attitude in which the main surface of the substrate W is slightly inclined from a vertical direction in addition to an attitude in which the main surface of the substrate W extends exactly in a vertical direction.

FIG. 6 shows that the transfer hand 12a of the transfer robot IR passes a substrate W in a standing attitude to the vertical pass 512 on the negative Y side included among the two vertical passes 51. The transfer hand 12a of the transfer robot IR moves forwardly from the negative X side toward the positive X side to bring the substrate W in the standing attitude into the space between the pair of grippers 52a and 52b of the vertical pass 512. In this state, the gripping mechanism 53 moves the lower gripper 52b upwardly. Then, the pair of grippers 52a and 52b grip the edge portions of the substrate W in the standing attitude. Thus, the vertical pass 512 holds the substrate W in the standing attitude. Thereafter, the gripping mechanism 37 of the transfer hand 12a moves the gripping portion 38 backwardly to release the grip of the substrate W, and the vertical pass 512 moves toward the negative Y side. Subsequently, the transfer hand 12a of the transfer robot IR moves backwardly toward the negative X side. In this manner, the process of passing the substrate W from the transfer hand 12a of the transfer robot IR to the vertical pass 512 is completed.

The movement of the vertical pass 512 toward the negative Y side prevents interference between the transfer hand 12a and the substrate W after the process of passing the substrate W from the transfer hand 12a to the vertical pass 512. After the transfer hand 12a is moved backwardly toward the negative X side, the substrate W in the standing attitude is gripped with stability by the pair of grippers 52a and 52b of the vertical pass 512. This prevents the substrate W from falling off or falling down. Although the transfer hand 12a of the transfer robot IR is shown as passing the substrate W to the substrate passing part 50 as an example in FIG. 6, the transfer hand 12b is capable of passing the substrate W similarly. It should be noted that the transfer hands 12a and 12b of the transfer robot IR and the transport hands 32a and 32b of the main transport robot MR are shaped not to interfere with the pair of grippers 52a and 52b, as shown in FIG. 6.

When the main transport robot MR receives the substrate W passed from the transfer robot IR to the substrate passing part 50 in the aforementioned manner, the transport hand 32a of the main transport robot MR moves forwardly from the positive X side toward the negative X side to a position opposed to the substrate W, with the substrate W held in the standing attitude by the vertical pass 512. Then, after the vertical pass 512 moves in a direction of the Y axis and the transport hand 32a grips the substrate W, the gripping mechanism 53 moves the lower gripper 52b downwardly to release the grip of the substrate W. Thereafter, the transport hand 32a which grips the substrate W moves backwardly, so that the substrate W is passed from the substrate passing part 50 to the main transport robot MR. The transport hand 32b of the main transport robot MR is capable of passing the substrate W similarly.

The process of passing the substrate W from the transfer robot IR via the substrate passing part 50 to the main transport robot MR is described as an instance. The transfer hands 12a and 12b of the transfer robot IR and the transport hands 32a and 32b of the main transport robot MR are similar in structure. The process of passing the substrate W from the main transport robot MR via the substrate passing part 50 to the transfer robot IR is done in exactly similar fashion. In this manner, the substrate W passed between the transfer robot IR and the main transport robot MR is held in the standing attitude by the substrate passing part 50.

The controller 5 controls various operating mechanisms provided in the substrate processing apparatus 1. FIG. 8 is a control block diagram of the controller 5. The controller 5 is similar in hardware configuration to typical computers. Specifically, the controller 5 includes a CPU 91 for performing various computation processes, a ROM 92 or read-only memory for storing a basic program therein, a RAM 93 or readable/writable memory for storing various pieces of information therein, and a magnetic disk 94 for storing control software and data therein. The controller 5 is electrically connected to the transfer robot IR, the main transport robot MR, the substrate passing part 50, the front surface cleaning processing units SS and the back surface cleaning processing units SSR which are provided in the substrate processing apparatus 1. The CPU 91 in the controller 5 executes a predetermined processing program stored in the magnetic disk 94, whereby the controller 5 controls the operation of passing substrates W between the transfer robot IR, the main transport robot MR and the substrate passing part 50, and the cleaning process operations in the front surface cleaning processing units SS and the back surface cleaning processing units SSR. This causes the processes in the substrate processing apparatus 1 to proceed.

Next, the operation of the substrate processing apparatus 1 will be described. The substrate processing apparatus 1, which includes the front surface cleaning processing units SS and the back surface cleaning processing units SSR, is capable of performing the cleaning processes having various patterns depending on the purpose. For example, the substrate processing apparatus 1 may clean only the front surfaces of substrates W, only the back surfaces thereof, or both the front and back surfaces thereof. Which one of the cleaning processes is to be performed may be determined by a recipe including descriptions about the transport procedure for substrates W (a substrate transport procedure is referred to simply as a "procedure") and about processing conditions. In the present preferred embodiment, an operation in which the back surface cleaning of a substrate W is performed first and the front surface cleaning thereof is thereafter performed will be taken as an example for description on the operation of the substrate processing apparatus 1. The operation to be described below is performed under the control of the controller 5 over the operating mechanisms of the substrate processing apparatus 1.

First, unprocessed substrates W stored in a cassette C is transported by an OHT and the like from the outside of the substrate processing apparatus 1 onto one of the cassette stages 11 of the indexer block ID. Next, the transfer robot IR of the indexer block ID takes one of the unprocessed substrates W out of the cassette C. An operation in which the N-th substrate W included in a lot (or batch) of substrates W to be processed in succession in accordance with the aforementioned procedure is taken out and subjected to a series of processes is taken as an example for description.

FIG. 9 shows a correlation between the position and attitude of substrates W. When stored in a cassette C, a substrate W assumes a horizontal attitude in which the front surface of the substrate W is positioned to face upward. The term "horizontal attitude" used herein refers to an attitude in which a main surface of the substrate W extends in a horizontal direction, that is, in which the normal to the main surface extends in a vertical direction. When a substrate W assumes a horizontal attitude, there are two cases where the front surface thereof is positioned to face upward and where the back surface thereof is positioned to face upward. In FIG. 9, "FRONT" denotes a horizontal attitude in which the front surface is positioned to face upward, and "BACK" denotes a horizontal attitude in which the back surface is positioned to face upward.

The transfer robot IR moves in a direction of the Y axis to the front position of the cassette C in which the N-th substrate W is stored, and the transfer hand 12b pivots and moves upwardly and downwardly so as to be opposed to the N-th substrate W. Subsequently, with the holding surface of the forked portion of the transfer hand 12b positioned to face upward, the transfer hand 12b is moved to immediately under the N-th substrate W, and is then moved upwardly to place the N-th substrate W on the holding surface. Then, the transfer hand 12b which holds the N-th substrate W thereon is moved backwardly, and the gripping mechanism 37 causes the gripping portion 38 to move forwardly, whereby the N-th substrate W is gripped with reliability by the two locking portions 34 and the gripping portion 38. Thus, the transfer robot IR takes the N-th substrate W out of the cassette C.

Next, while causing the transfer hand 12b which holds the N-th substrate W thereon to pivot and move upwardly and downwardly, the transfer robot IR moves in a direction of the Y axis to the front position of the substrate passing part 50 to cause the transfer hand 12b to be opposed to the substrate passing part 50. At the same time that the transfer robot IR moves horizontally, pivots and moves upwardly and downwardly, the rotary actuator 16 causes the transfer hand 12b to rotate through 90 degrees, for example, so that the front surface of the N-th substrate W faces the positive Y side of FIG. 7. That is, while rotating the N-th substrate W gripped by the transfer hand 12b through 90 degrees about the axis extending in a horizontal direction, the transfer robot IR transports the N-th substrate W from the cassette C to the substrate passing part 50. Thus, as shown in FIG. 9, while the N-th substrate W is transported by the transfer robot IR, the attitude of the N-th substrate W is changed from a horizontal attitude in which the front surface thereof is positioned to face upward into a standing attitude.

Next, the transfer robot IR passes the N-th substrate W to the vertical pass 512 of the substrate passing part 50. In the present preferred embodiment, the two vertical passes 511 and 512 are provided in the substrate passing part 50, and are used for different purposes in such a manner that the vertical pass 512 is intended for the use of unprocessed substrates W and the vertical pass 511 is intended for the use of substrates W subjected to the cleaning process. The transfer robot IR passes the N-th substrate W to the vertical pass 512 intended for the use of unprocessed substrates W. At this time, the transfer robot IR causes the transfer hand 12b which holds the N-th substrate W in the standing attitude thereon to move forwardly toward the positive X side, thereby inserting the N-th substrate W into the space between the pair of grippers 52a and 52b (with reference to FIG. 6). Then, the gripping mechanism 53 of the vertical pass 512 moves the lower gripper 52b upwardly, so that the pair of grippers 52a and 52b grip the N-th substrate W in the standing attitude. Thereafter, the transfer robot IR releases the grip of the N-th substrate W by means of the gripping mechanism 37 of the transfer hand 12b, and the vertical pass 512 moves toward the negative Y side. Then, the transfer robot IR moves the transfer hand 12b backwardly toward the negative X side. This completes the process of passing the N-th substrate W from the transfer robot IR to the substrate passing part 50. As shown in FIG. 9, the vertical pass 512 of the substrate passing part 50 holds the N-th substrate W in the standing attitude.

After the N-th substrate W is passed to the vertical pass 512, the main transport robot MR receives the N-th substrate W. At this time, the main transport robot MR pivots and moves upwardly and downwardly to move the two transport hands 32a and 32b to a position opposed to the substrate passing part 50, and causes the rotary actuator 36 to rotate the transport hands 32a and 32b through 90 degrees from a horizontal attitude. The main transport robot MR causes the transport hand 32b assuming an attitude parallel to the N-th substrate W held in the standing attitude by the vertical pass 512 to move forwardly from the positive X side toward the negative X side and to stop at a position opposed to the N-th substrate W. Then, the vertical pass 512 moves toward the positive Y side, so that the N-th substrate W comes into contact with the transport hand 32b. Thereafter, the gripping mechanism 37 of the transport hand 32b causes the gripping portion 38 to move forwardly, so that the N-th substrate W is gripped with reliability by the two locking portions 34 and the gripping portion 38. Thus, the transport hand 32b of the main transport robot MR holds the N-th substrate W in the standing attitude. Thereafter, the gripping mechanism 53 causes the lower gripper 52b to move downwardly, thereby releasing the grip of the N-th substrate W, and the vertical pass 512 moves toward the negative Y side. Subsequently, the main transport robot MR moves the transport hand 32b backwardly toward the positive X side. This completes the process of passing the N-th substrate W from the vertical pass 512 to the transport hand 32b of the main transport robot MR. In this manner, while being held in the standing attitude, the N-th substrate W is transferred from the substrate passing part 50 to the main transport robot MR.

Next, the main transport robot MR pivots and moves upwardly and downwardly so that the transport hand 32b which holds the N-th substrate W thereon is opposed to any one of the four back surface cleaning processing units SSR. At the same time that the main transport robot MR pivots and moves upwardly and downwardly, the rotary actuator 36 causes the transport hands 32a and 32b to rotate through 90 degrees so that the attitude of the N-th substrate W is changed from the standing attitude into a horizontal attitude in which the back surface thereof is positioned to face upward. That is, while rotating the N-th substrate W gripped by the transport hand 32b through 90 degrees about the axis extending in a horizontal direction, the main transport robot MR transports the N-th substrate W from the substrate passing part 50 to the back surface cleaning processing unit SSR which is one of the processing parts. Thus, as shown in FIG. 9, while the N-th substrate W is transported by the main transport robot MR, the attitude of the N-th substrate W is changed from the standing attitude into the horizontal attitude in which the back surface thereof is positioned to face upward.

The four back surface cleaning processing units SSR are provided in the substrate processing apparatus 1 according to the present preferred embodiment. For consecutive processing is performed on a lot (or batch) of substrates W, these four back surface cleaning processing units SSR are in general used in sequential order. Thus, the (N−4)th substrate W is processed before the N-th substrate W in the back surface cleaning processing unit SSR which processes the N-th substrate W. The main transport robot MR replaces the (N−4)th substrate W subjected to the back surface cleaning process with the unprocessed N-th substrate W in this back surface cleaning processing unit SSR. Specifically, the main transport robot MR takes the (N−4)th substrate W subjected to the back surface cleaning process out of the back surface cleaning processing unit SSR by means of the transport hand 32a and thereafter transports the unprocessed N-th substrate W into the back surface cleaning processing unit SSR by means of the transport hand 32b.

The main transport robot MR passes the N-th substrate W held in the horizontal attitude in which the back surface thereof is positioned to face upward to the spin chuck 26 of the back surface cleaning processing unit SSR. The back surface cleaning processing unit SSR holds the N-th substrate W in the horizontal attitude in which the back surface thereof is positioned to face upward to perform the back surface cleaning process thereon. The attitude of the substrate W is not changed in this step of back surface cleaning.

After a predetermined time period has elapsed so that the back surface cleaning process of the N-th substrate W is completed, the N-th substrate W is transported by the main transport robot MR out of the back surface cleaning processing unit SSR. At this time, the N-th substrate W subjected to the back surface cleaning process is replaced with the unprocessed (N+4)th substrate W. The main transport robot MR takes the N-th substrate W subjected to the back surface cleaning process out of the back surface cleaning processing unit SSR by means of the transport hand 32a, and thereafter transports the unprocessed (N+4)th substrate W into the back surface cleaning processing unit SSR by means of the transport hand 32b. While being held in the horizontal attitude in which the back surface thereof is positioned to face upward, the N-th substrate W subjected to the back surface cleaning process is taken out of the back surface cleaning processing unit SSR by means of the transport hand 32a of the main transport robot MR.

Next, the main transport robot MR pivots and moves upwardly and downwardly so that the transport hand 32a which holds the N-th substrate W thereon is opposed to any one of the four front surface cleaning processing units SS. At the same time that the main transport robot MR pivots and moves upwardly and downwardly, the rotary actuator 36 causes the transport hands 32a and 32b to rotate through 180 degrees so that the N-th substrate W is inverted from the horizontal attitude in which the back surface thereof is positioned to face upward into a horizontal attitude in which the front surface thereof is positioned to face upward. That is, while inverting the N-th substrate W gripped by the transport hand 32a 180 degrees about the axis extending in a horizontal direction, the main transport robot MR transports the N-th substrate W from the back surface cleaning processing unit SSR to the front surface cleaning processing unit SS. Thus, as shown in FIG. 9, while the N-th substrate W is transported by the main transport robot MR from the back surface cleaning processing unit SSR to the front surface cleaning processing unit SS, the attitude of the N-th substrate W is changed from the horizontal attitude in which the back surface thereof is positioned to face upward into the horizontal attitude in which the front surface thereof is positioned to face upward.

As in the case of the back surface cleaning process, the (N−4)th substrate W is processed before the N-th substrate W in the front surface cleaning processing units SS. Thus, the (N−4)th substrate W is replaced with the N-th substrate W in this front surface cleaning processing units SS. The main transport robot MR takes the (N−4)th substrate W subjected to the front surface cleaning process out of the front surface cleaning processing unit SS by means of the transport hand 32b and thereafter transports the N-th substrate W subjected to only the back surface cleaning process into the front surface cleaning processing unit SS by means of the transport hand 32a.

The main transport robot MR passes the N-th substrate W held in the horizontal attitude in which the front surface thereof is positioned to face upward to the spin chuck 21 of the front surface cleaning processing unit SS. The front surface cleaning processing unit SS holds the N-th substrate W in the horizontal attitude in which the front surface thereof is positioned to face upward to perform the front surface cleaning process thereon. The attitude of the substrate W is not changed in this step of front surface cleaning.

After a predetermined time period has elapsed so that the front surface cleaning process of the N-th substrate W is completed, the N-th substrate W is transported by the main transport robot MR out of the front surface cleaning processing unit SS. At this time, the N-th substrate W subjected to the front surface cleaning process is replaced with the (N+4)th substrate W subjected to the back surface cleaning process. The main transport robot MR takes the N-th substrate W subjected to the front surface cleaning process out of the front surface cleaning processing unit SS by means of the transport hand 32b, and thereafter transports the (N+4)th substrate W subjected to only the back surface cleaning process into the front surface cleaning processing unit SS by means of the transport hand 32a. While being held in the horizontal attitude in which the front surface thereof is positioned to face upward, the N-th substrate W subjected to the front surface cleaning process is taken out of the front surface cleaning processing unit SS by means of the transport hand 32b of the main transport robot MR.

Next, the main transport robot MR pivots and moves upwardly and downwardly so that the transport hand 32b which holds the N-th substrate W thereon is opposed to the substrate passing part 50. At the same time that the main transport robot MR pivots and moves upwardly and downwardly, the rotary actuator 36 causes the transport hands 32a and 32b to rotate through 90 degrees so that the attitude of the N-th substrate W is changed from the horizontal attitude into a standing attitude. That is, while rotating the N-th substrate W gripped by the transport hand 32b through 90 degrees about the axis extending in a horizontal direction, the main transport robot MR transports the N-th substrate W from the front surface cleaning processing unit SS which is one of the processing parts to the substrate passing part 50. Thus, as shown in FIG. 9, while the N-th substrate W is transported by the main transport robot MR, the attitude of the N-th substrate W is changed from the horizontal attitude in which the front surface thereof is positioned to face upward into the standing attitude.

Next, the main transport robot MR passes the N-th substrate W to the vertical pass 511 intended for the use of substrates W subjected to the cleaning process and included in the substrate passing part 50. The operation at this time is similar to that of the transfer robot IR described above. Specifically, the main transport robot MR causes the transport hand 32b which holds the N-th substrate W in the standing attitude to move forwardly toward the negative X side to insert the N-th substrate W into the space between the pair of grippers 52a and 52b. The gripping mechanism 53 of the vertical pass 511 causes the lower gripper 52b to move upwardly. Then, the pair of grippers 52a and 52b grip the N-th substrate W in the standing attitude. Thereafter, the main transport robot MR releases the grip of the N-th substrate W by means of the transport hand 32b, and the vertical pass 511 moves in a direction of the Y axis. Then, the main transport robot MR causes the transport hand 32b to move backwardly. This completes the process of passing the N-th substrate W from the main transport robot MR to the substrate passing part 50. As shown in FIG. 9, the vertical pass 511 of the substrate passing part 50 holds the N-th substrate W in the standing attitude.

After the N-th substrate W is transferred to the vertical pass 511 intended for the use of substrates W subjected to the cleaning process, the transfer robot IR takes the N-th substrate W out of the vertical pass 511. The operation at this time is similar to the operation of the main transport robot MR taking the substrate W out of the vertical passes 51. Specifically, the transfer robot IR causes the transfer hand 12a assuming an attitude parallel to the N-th substrate W held in the standing attitude by the vertical pass 511 to move forwardly toward the positive X side and to stop at a position opposed to the N-th substrate W. Then, the vertical pass 511 moves in a direction of the Y axis, so that the N-th substrate W comes into contact with the transfer hand 12a. Thereafter, the gripping mechanism 37 of the transfer hand 12a causes the gripping portion 38 to move forwardly, so that the N-th substrate W is gripped with reliability by the two locking portions 34 and the gripping portion 38. Thus, the transfer hand 12a of the transfer robot IR holds the N-th substrate W in a standing attitude. Thereafter, the gripping mechanism 53 causes the lower gripper 52b to move downwardly, thereby releasing the grip of the N-th substrate W, and the vertical pass 511 moves in a direction of the Y axis. Thereafter, the transfer robot IR causes the transfer hand 12a to move backwardly toward the negative X side. In this manner, while being held in the standing attitude, the N-th substrate W is passed from the substrate passing part 50 to the transfer robot IR.

Next, the transfer robot IR moves in a direction of the Y axis to the front position of a cassette C which is to receive a processed substrate W therein, and pivots and moves upwardly and downwardly so that the transfer hand 12a which holds the N-th substrate W thereon is opposed to the cassette C. At the same time that the transfer robot IR moves horizontally, pivots and moves upwardly and downwardly, the rotary actuator 16 causes the transfer hand 12a to rotate through 90 degrees, so that the attitude of the N-th substrate W is changed from the standing attitude into a horizontal attitude in which the front surface thereof is positioned to face upward. That is, while rotating the N-th substrate W gripped by the transfer hand 12a through 90 degrees about the axis extending in a horizontal direction, the transfer robot IR transports the N-th substrate W from the substrate passing part 50 to the cassette C. Thus, as shown in FIG. 9, while the N-th substrate W is transported by the transfer robot IR, the attitude of the N-th substrate W is changed from the standing attitude into the horizontal attitude in which the front surface thereof is positioned to face upward.

Finally, the transfer robot IR causes the transfer hand 12a which holds the N-th substrate W thereon to move forwardly, thereby releasing the grip of the N-th substrate W. Then, the transfer robot IR moves slightly downwardly to pass the processed N-th substrate W to the cassette C. In this manner, the sequential processes of the N-th substrate W are completed. The cassette C in which a predetermined number of processed substrates W are stored is transported to the outside of the substrate processing apparatus 1 by an OHT and the like.

For the transport of a substrate W from a cassette C to a back surface cleaning processing unit SSR in the first preferred embodiment, the transfer robot IR rotates the substrate W through 90 degrees to change the attitude of the substrate W from a horizontal attitude in which the front surface thereof is positioned to face upward into a standing attitude while transporting the substrate W from the cassette C to the substrate passing part 50, and passes the substrate W in the standing attitude to the substrate passing part 50. The main transport robot MR receives the substrate W held in the standing attitude. While transporting the substrate W from the substrate passing part 50 to the back surface cleaning processing unit SSR, the main transport robot MR rotates the substrate W through 90 degrees to change the attitude of the substrate W from the standing attitude into a horizontal attitude in which the back surface thereof is positioned to face upward.

For the 180-degree inversion of the substrate W in the first preferred embodiment, the transfer robot IR rotates the substrate W through 90 degrees, and the main transport robot MR rotates the substrate W through 90 degrees. To achieve this, the substrate passing part 50 holds the substrate W passed between the transfer robot IR and the main transport robot MR in the standing attitude.

The transfer robot IR rotates the substrate W through 90 degrees while transporting the substrate W from the cassette C to the substrate passing part 50, and the main transport robot MR rotates the substrate W through 90 degrees while transporting the substrate W from the substrate passing part 50 to the back surface cleaning processing unit SSR. That is, each of the transfer robot IR and the main transport robot MR is responsible for the rotation of the substrate W through 90 degrees to achieve the 180-degree inversion of the substrate W. In addition, each of the transfer robot IR and the main transport robot MR rotates the substrate W through 90 degrees while transporting the substrate W.

In fact, the step of inverting the substrate W 180 degrees is executed at the same time as the step of transporting the substrate W from the cassette C via the substrate passing part 50 to the back surface cleaning processing unit SSR. This shortens the time required to invert the substrate W and to transport the substrate W to a processing part, as compared with the background art techniques. As a result, the throughput of the substrate processing apparatus 1 is improved.

Although the substrate passing part 50 includes the two vertical passes 51 for the purpose of holding the substrate W in the standing attitude, the footprint of (the area taken up by) the substrate passing part 50 is significantly small, as compared with a background art inverting unit. This suppresses the increase in the size of the substrate processing apparatus 1, and contributes to the effective use of the space within the substrate processing apparatus 1.

In particular, when the substrate W is a large-diameter semiconductor wafer having a diameter of 450 mm, a passing part which places the substrate W in a horizontal attitude in a conventional manner or an inverting unit as disclosed in U.S. Patent Application Publication No. 2008/0156351 occupies a very large space. The provision of the substrate passing part 50 which holds the substrate W in the standing attitude as mentioned above significantly reduces the space occupied thereby. The effect of such effective use of the space increases with the increase in the size of the substrate W, or is greater for the substrate W having a diameter of 450 mm than for the substrate W having a diameter of 300 mm.

Also, when the substrate W is a large-diameter semiconductor wafer having a diameter of 450 mm, the 180-degree inversion of such a substrate W requires longer time than that of a semiconductor wafer having a diameter of 300 mm or less. In this preferred embodiment, each of the transfer robot IR and the main transport robot MR rotates the substrate W through 90 degrees as mentioned above while transporting the substrate W. This suppresses the increase in the time required to invert the substrate W and to transport the substrate W to a processing part.

Second Preferred Embodiment

Next, a second preferred embodiment according to the present invention will be described. A substrate processing apparatus according to the second preferred embodiment is exactly identical in configuration with the substrate processing apparatus 1 according to the first preferred embodiment. The transport procedure for a substrate W according to the second preferred embodiment is also similar to that according to the first preferred embodiment. The second preferred embodiment differs from the first preferred embodiment in limiting the time to rotate the hands as a process in which the transfer robot IR and the main transport robot MR rotate a substrate W while transporting the substrate W.

Figure 10:
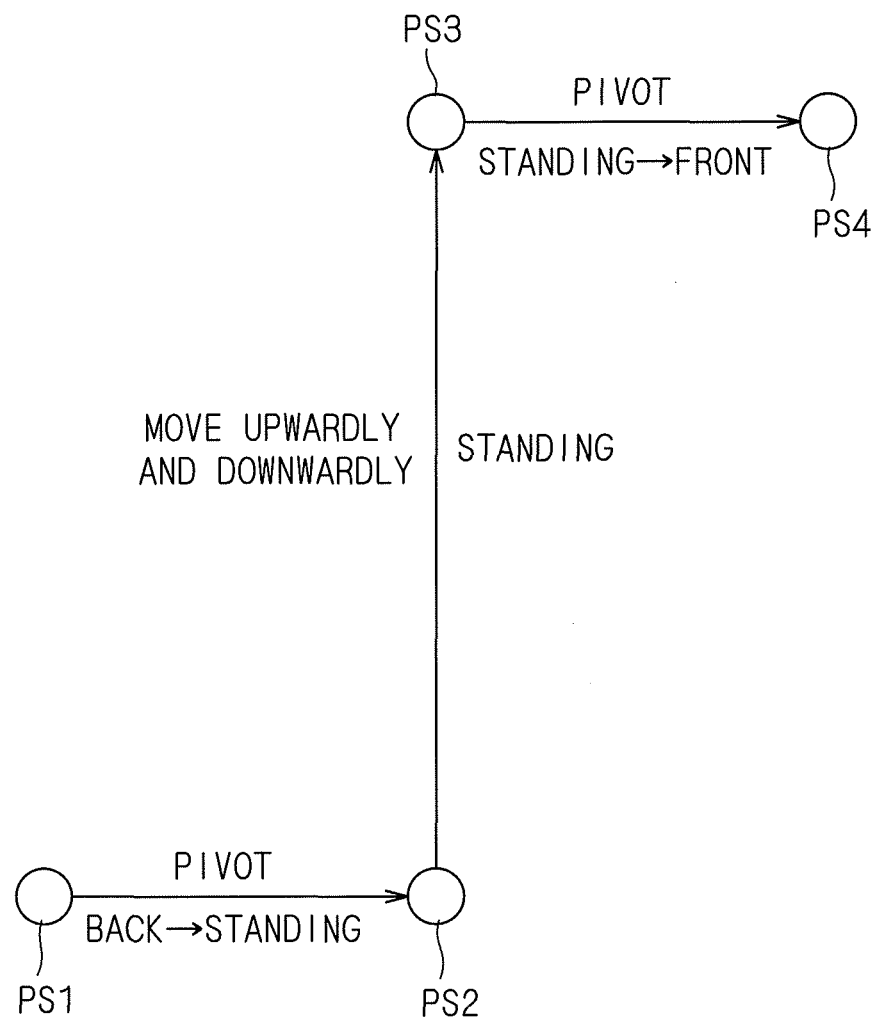
FIG. 10 schematically shows a substrate transport operation of the main transport robot according to a second preferred embodiment of the present invention.

In the second preferred embodiment, the transfer robot IR and the main transport robot MR hold a substrate W in a standing attitude when moving upwardly and downwardly in a vertical direction (in a direction of the Z axis). FIG. 10 schematically shows an operation in which the main transport robot MR transports a substrate W from a back surface cleaning processing unit SSR to a front surface cleaning processing unit SS in the second preferred embodiment.

After receiving a substrate W subjected to the back surface cleaning process by means of the transport hand 32a, the main transport robot MR pivots the transport hand 32a from a position PS1 opposed to the back surface cleaning processing unit SSR to a position PS2 lying within the same horizontal plane as the position PS1. At the same time that the main transport robot MR pivots, the rotary actuator 36 causes the transport hands 32a and 32b to rotate through 90 degrees so that the attitude of the substrate W is changed from a horizontal attitude in which the back surface thereof is positioned to face upward into a standing attitude. That is, while pivoting the transport hand 32a which holds the substrate W thereon within a horizontal plane, the main transport robot MR rotates the transport hand 32a through 90 degrees. The main transport robot MR does not move upwardly and downwardly while pivoting the transport hand 32a from the position PS1 to the position PS2.

Subsequently, the main transport robot MR causes the transport hand 32a which holds the substrate W in the standing attitude to move upwardly from the position PS2 to a position PS3 lying vertically above the position PS2. During this movement, the transport hand 32a does not rotate. That is, the main transport robot MR moves the transport hand 32a upwardly and downwardly while the substrate W gripped by the transport hand 32a is held in the standing attitude. The main transport robot MR does not pivot while moving the transport hand 32a upwardly from the position PS2 to the position PS3.

Next, the main transport robot MR pivots the transport hand 32a from the position PS3 to a position PS4 opposed to the front surface cleaning processing unit SS. The position PS3 and the position PS4 are within the same horizontal plane. At the same time that the main transport robot MR pivots, the rotary actuator 36 causes the transport hands 32a and 32b to rotate through 90 degrees so that the attitude of the substrate W is changed from the standing attitude into a horizontal attitude in which the front surface thereof is positioned to face upward. That is, while pivoting the transport hand 32a which holds the substrate W within a horizontal plane, the main transport robot MR rotates the transport hand 32a through 90 degrees. The main transport robot MR does not move upwardly and downwardly while pivoting the transport hand 32a from the position PS3 to the position PS4.

In the second preferred embodiment, the main transport robot MR transports the substrate W from the back surface cleaning processing unit SSR to the front surface cleaning processing unit SS in the aforementioned manner. The main transport robot MR moves upwardly and downwardly in a vertical direction while holding the substrate W gripped by the transport hand 32a in the standing attitude. This minimizes air resistance exerted on the substrate W during the upward and downward movements. Thus, the main transport robot MR is capable of smoothly moving the substrate W upwardly and downwardly. In particular, when a downflow running from above to below is formed in the substrate processing apparatus 1, it is effective that the main transport robot MR causes the substrate W to assume the standing attitude when moving the substrate W upwardly.

When the main transport robot MR moves upwardly and downwardly in a vertical direction, the substrate W is held in the standing attitude. This minimizes particles deposited on the main surfaces of the substrate W.

If a semiconductor wafer having a diameter of 450 mm whose future developments are being contemplated is used as the substrate W, the upward and downward movements of the substrate W held in a horizontal attitude causes air resistance to become significantly greater than that in the background art, thereby inevitably requiring the suppression of the transport speed of the substrate W. The vertically upward and downward movements of the substrate W gripped by the transport hand 32a and held in the standing attitude as in the second preferred embodiment allows the smooth upward and downward movements of the substrate W even if the substrate W is a semiconductor wafer having a diameter of 450 mm. This prevents the decrease in the transport speed.

The instance in which the main transport robot MR transports the substrate W from the back surface cleaning processing unit SSR to the front surface cleaning processing unit SS is illustrated in FIG. 10. In the cases in which the transfer robot IR transports a substrate W between a cassette C and the substrate passing part 50 and in which the main transport robot MR transports a substrate W between the substrate passing part 50 and a processing part, the smooth upward and downward movements of the substrate W are similarly achieved by the vertically upward and downward movements of the substrate W held in the standing attitude.

Further, the pivot and rotation of a hand may be separated. Specifically, the transfer robot IR or the main transport robot MR pivots the hand while the substrate W is held in a horizontal attitude, rotates the hand through 90 degrees to hold the substrate W in a standing attitude after the completion of the pivot, and thereafter moves the hand which grips the substrate W in the standing attitude upwardly and downwardly in a vertical direction. This minimizes air resistance exerted on the substrate W not only during the upward and downward movements but also during the pivot.

3. Modifications

Although the preferred embodiments according to the present invention have been described hereinabove, various modifications in addition to the above may be made therein without departing from the spirit and scope of the present invention. For example, the transfer hands 12a and 12b of the transfer robot IR and the transport hands 32a and 32b of the main transport robot MR are rotatable through 180 degrees in the aforementioned preferred embodiments. However, the transfer hands 12a and 12b of the transfer robot IR may be rotatable through at least 90 degrees. When only either the front surface cleaning processing units SS or the back surface cleaning processing units SSR are mounted in the substrate processing apparatus 1, there is no need to invert the substrate W between the front surface cleaning processing units SS and the back surface cleaning processing units SSR. In such a case, the transport hands 32a and 32b of the main transport robot MR may be rotatable through at least 90 degrees.

The transfer hands 12a and 12b of the transfer robot IR and the transport hands 32a and 32b of the main transport robot MR are rotated about an axis parallel to a direction in which the hands are moved forwardly and backwardly in the aforementioned preferred embodiments, but are not limited to such a configuration. The transfer hands 12a and 12b of the transfer robot IR and the transport hands 32a and 32b of the main transport robot MR may be rotated about an axis perpendicular to a direction in which the hands are moved forwardly and backwardly. That is, the transfer hands 12a and 12b of the transfer robot IR and the transport hands 32a and 32b of the main transport robot MR may be rotatable through at least 90 degrees about an axis extending in a horizontal direction.

Figure 11:
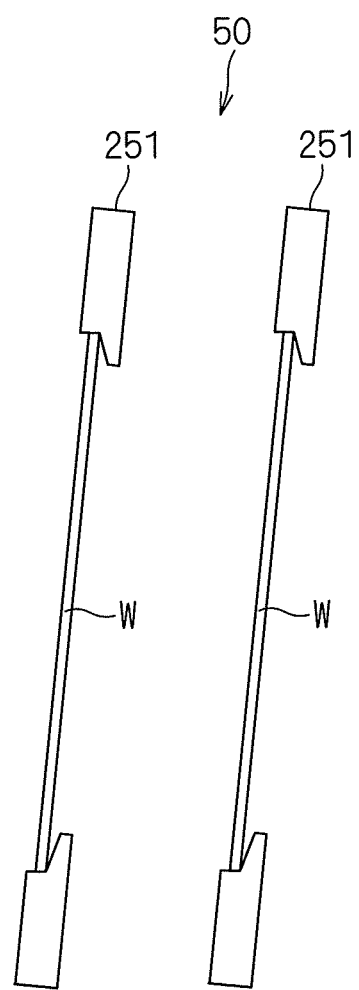
FIG. 11 is a view showing another example of the structure of the substrate passing part.

The substrate passing part 50 may have a structure as shown in FIG. 11. The substrate passing part 50 of FIG. 11 includes two vertical passes 251. The two vertical passes 251 are provided to assume an attitude slightly inclined with respect to a vertical direction. As in FIG. 7, the two vertical passes 251 are movable slightly laterally by a slide drive mechanism not shown.

The vertical passes 251 of FIG. 11, which are provided to assume an attitude slightly inclined with respect to a vertical direction, are capable of holding a substrate W without gripping the substrate W, unlike the vertical passes 511 and 512 in the aforementioned preferred embodiments. As mentioned above, the "standing attitude" includes an attitude in which the main surface of the substrate W is slightly inclined from the vertical direction. Thus, the substrate passing part 50 of FIG. 11 also holds a substrate W passed between the transfer robot IR and the main transport robot MR in the standing attitude.

Both the back surface cleaning process and the front surface cleaning process are performed on a substrate W in the aforementioned preferred embodiments. However, only one of the back surface cleaning process and the front surface cleaning process may be performed on a substrate W. Also in this case, the main transport robot MR changes the attitude of the substrate W by rotating the substrate W through 90 degrees while transporting the substrate W between the substrate passing part 50 and the back surface cleaning processing units SSR or the front surface cleaning processing units SS.

The arrangement of the processing parts is not limited to that shown in FIG. 2. For example, the four back surface cleaning processing units SSR may be arranged in stacked relation in the first processing part array PL1, whereas the four front surface cleaning processing units SS are arranged in stacked relation in the second processing part array PL2.

The processing parts mounted in the substrate processing apparatus 1 are not limited to the front surface cleaning processing units SS and the back surface cleaning processing units SSR, but may include a unit which supplies a processing liquid such as an etchant to the front surface of a substrate W to perform a process on the substrate W, for example. Even when only a unit which performs a process on a substrate W with a front surface positioned to face upward is mounted as a processing part in the substrate processing apparatus 1, the main transport robot MR changes the attitude of the substrate W by rotating the substrate W through 90 degrees while transporting the substrate W between the substrate passing part 50 and the processing part to thereby produce effects similar to those of the aforementioned preferred embodiments.

In the aforementioned preferred embodiments, the vertical passes 51 move horizontally to pass a substrate W between the transfer robot IR and the substrate passing part 50 and between the main transport robot MR and the substrate passing part 50. Instead, the transfer robot IR and/or the main transport robot MR may move horizontally to pass a substrate W to and from the substrate passing part 50.

While the invention has been described in detail, the foregoing description is in all aspects illustrative and not restrictive. It is understood that numerous other modifications and variations can be devised without departing from the scope of the invention.

What is claimed is:

1. A method of processing a substrate, comprising the steps of:
 (a) taking an unprocessed substrate out of a cassette to pass the unprocessed substrate to a passing part by means of a transfer robot while rotating the unprocessed substrate through 90 degrees about a second rotation axis extending in a horizontal direction;
 (b) holding said unprocessed substrate received from said transfer robot in a standing attitude by means of said passing part;
 (c) transferring said unprocessed substrate from said passing part to a main transport robot to transport said unprocessed substrate to a processing part by means of said main transport robot while rotating said unprocessed substrate through 90 degrees about a first rotation axis extending in a horizontal direction;
 (d) transferring a processed substrate from said processing part to said main transport robot to pass said processed substrate to said passing part by means of said main transport robot while rotating said processed substrate through 90 degrees about said first rotation axis;

(e) holding said processed substrate received from said main transport robot in a standing attitude by means of said passing part; and (f) transferring said processed substrate from said passing part to said transfer robot to transport said processed substrate into a cassette by means of said transfer robot while rotating said processed substrate through 90 degrees about said second rotation axis, said steps (a) and (f) including the step of moving a second hand for gripping said substrate forwardly and backwardly in a direction parallel to said second rotation axis by means of said transfer robot, said steps (c) and (d) including the step of moving a first hand for gripping said substrate forwardly and backwardly in a direction parallel to said first rotation axis by means of said main transport robot, said steps (a) and (f) including the step of moving the substrate upwardly and downwardly in a vertical direction by means of said transfer robot while maintaining the substrate in a standing attitude without pivoting, said steps (c) and (d) include the step of moving the substrate upwardly and downwardly in a vertical direction by means of said main transport robot while maintaining the substrate in a standing attitude without pivoting, wherein said processing part includes a back surface cleaning processing unit for cleaning the back surface of a substrate; and said transfer robot rotates said substrate received from said cassette through 90 degrees in said step (a) and said main transport robot rotates said substrate received from said passing part through 90 degrees in said step (c) to invert and transport the substrate to said back surface cleaning processing unit.

2. The method according to claim 1, wherein said processing part includes a front surface cleaning processing unit for cleaning the front surface of a substrate, the method further comprising the step of (g) transporting a substrate taken out of said back surface cleaning processing unit to said front surface cleaning processing unit by means of said main transport robot while rotating said substrate through 180 degrees about said first rotation axis.

3. The method according to claim 1, wherein:
said substrate is a semiconductor wafer having a diameter of 450 mm.

4. The method according to claim 1, wherein:
at least one first forward and backward moving mechanism of said main transport robot is provided closer to an edge of said first hand than to said first rotation mechanism; and
at least one second forward and backward moving mechanism of said transfer robot is provided closer to an edge of said second hand than to said second rotation mechanism.

5. The method according to claim 4, wherein:
said at least one first forward and backward moving mechanism comprises two first forward and backward moving mechanisms each being provided with said first hand and for independently moving the corresponding first hand forwardly and backwardly; and
said at least one second forward and backward moving mechanism comprises two second forward and backward moving mechanisms each being provided with said second hand and for independently moving the corresponding second hand forwardly and backwardly.

6. A method of processing a substrate, comprising the steps of:

(a) receiving a processed substrate from a back surface cleaning processing unit for cleaning the back surface of a substrate to pass the processed substrate to a passing part by means of a main transport robot while rotating the processed substrate through 90 degrees about a first rotation axis extending in a horizontal direction;

(b) holding said processed substrate received from said main transport robot in a standing attitude by means of said passing part;

(c) receiving said processed substrate from said passing part to transport and store said processed substrate into a cassette by means of a transfer robot while rotating said processing substrate through 90 degrees about a second rotation axis extending in a horizontal direction;

said step (a) including the step of moving a first hand for gripping said substrate forwardly and backwardly in a direction parallel to said first rotation axis by means of said main transport robot, said step (c) including the step of moving a second hand for gripping said substrate forwardly and backwardly in a direction parallel to said second rotation axis by means of said transfer robot, said step (a) including the step of moving the substrate upwardly and downwardly in a vertical direction by means of said main transport robot while maintaining the substrate in a standing attitude without pivoting, and said step (c) including the step of moving the substrate upwardly and downwardly in a vertical direction by means of said transfer robot while maintaining the substrate in a standing attitude without pivoting, wherein said main transport robot rotates said substrate received from said back surface cleaning processing unit through 90 degrees in said step (a) and said transfer robot rotates said substrate received from said passing part through 90 degrees in said step (c) to invert and transport the substrate to said cassette.

7. The method according to claim 6, wherein
before said step (a), said main transport robot receives the substrate from a front surface cleaning processing unit for cleaning the front surface of a substrate, the substrate being subjected to the front surface cleaning, to transport the substrate to said back surface cleaning processing unit while rotating the substrate through 180 degrees about said first rotation axis.

* * * * *